US012671435B1

(12) United States Patent
Shaker et al.

(10) Patent No.: US 12,671,435 B1
(45) Date of Patent: Jun. 30, 2026

(54) DIGITAL SIGNAL GENERATOR WITH FREQUENCY-DEPENDENT CORRECTIONS FOR DAC AND ANALOG NON-IDEALITIES

(71) Applicant: Keysight Technologies, Inc., Santa Rosa, CA (US)

(72) Inventors: Joseph Shaker, Colorado Springs, CO (US); Ryan Pearson, Colorado Springs, CO (US); Daniel James Huber, Santa Clara, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 79 days.

(21) Appl. No.: 18/769,811

(22) Filed: Jul. 11, 2024

(51) Int. Cl.
*H03M 1/66* (2006.01)
*H03M 1/74* (2006.01)

(52) U.S. Cl.
CPC ........... *H03M 1/665* (2013.01); *H03M 1/662* (2013.01); *H03M 1/74* (2013.01)

(58) Field of Classification Search
CPC ......... H03M 1/665; H03M 1/662; H03M 1/74

USPC ......................................... 341/117, 143, 144
See application file for complete search history.

(56) References Cited

U.S. PATENT DOCUMENTS

| | | | |
|---|---|---|---|
| 9,784,818 B1 * | 10/2017 | Doerry | .................... G01S 13/26 |
| 10,623,031 B2 | 4/2020 | Delos et al. | |
| 11,303,287 B1 * | 4/2022 | Turner | .................. H03L 7/1976 |

* cited by examiner

*Primary Examiner* — Khai M Nguyen

(57) ABSTRACT

A digital signal generator includes a numerically controlled oscillator (NCO) configured to generate a modulated phase signal, and to convert the modulated phase signal into a sinusoidal output signal, and a pre-distortion module configured to adjust a phase of the phase-modulated signal prior to conversion to the sinusoidal output signal, and to adjust an amplitude of the sinusoidal output signal to obtain a pre-distorted digital output signal. The phase and amplitude adjustments are frequency dependent, and the pre-distortion module is configured to determine an instantaneous frequency of the NCO by computing a derivative of the modulated phase signal, and to address a memory table correlating the determined instantaneous frequency with the phase and amplitude adjustments.

17 Claims, 5 Drawing Sheets

DIGITAL SIGNAL GENERATOR WITH FREQUENCY-DEPENDENT CORRECTIONS FOR DAC AND ANALOG NON-IDEALITIES

FIELD

The inventive concepts generally relate to digital signal generators, and more particularly, the inventive concepts relate to digital pre-distortion techniques implemented by digital signal generators.

BACKGROUND

Mixed-signal integrated circuits (ICs) that include both analog and digital components are widely used in various applications, such as communication systems, audio and video processing, and instrumentation. One of the challenges in designing mixed-signal ICs is achieving high-fidelity signal generation and conversion between the digital and analog domains. Non-idealities in digital-to-analog converters (DACs), such as channel non-flatness, time interleave errors, and other distortions, can degrade the quality of an output signal.

For example, signal sources systems may contain digital generation of waveforms, followed by a digital-to-analog conversion (DAC), followed by amplification and other downstream analog circuitry. The DACs and downstream analog circuitry have non-idealities that are typically corrected for by digital pre-distortion (DPD). In DPD, an ideal digital signal is adjusted so that after going through the non-idealities in the analog domain the output will be as close to a representation of the ideal digital signal as possible. However, at high sample rates, these kinds of corrections can be quite expensive in digital power and area.

SUMMARY

According to an aspect of the inventive concepts, a system is provided includes a digital signal generator configured to generate a digital signal x[n] of a given sampling frequency Fs, and a digital-to-analog converter (DAC) configured to convert the digital signal x[n] to an analog signal having an effective sampling frequency Fs. The digital signal x[n] may be a narrowband modulated continuous wave (CW) signal. The digital signal generator includes a phase accumulator and first adder configured to output a modulated phase signal $\varphi[n]$, where $\varphi[n]$ denotes an instantaneous phase of each nth sample of the modulated phase signal $\varphi[n]$, and a second adder configured to sum the modulated phase signal $\varphi[n]$ and a phase correction value to obtain a phase-corrected modulated phase signal $\varphi'[n]$. The digital signal generator further includes a phase to amplitude converter configured to covert the phase-corrected modulated phase signal $\varphi'[n]$ to a modulated sinusoidal output signal y[n], and a multiplier configured to multiply the periodic output signal y[n] by an amplitude correction value to obtain the digital signal x[n]. The phase and amplitude correction values are frequency dependent, and the system is configured to determine an instantaneous frequency of the modulated phase signal $\varphi[n]$ by computing a derivative of the modulated phase signal $\varphi[n]$, and to address a memory table correlating the determined instantaneous frequency with the phase and amplitude correction values, The phase correction value and the amplitude correction value are set to compensate for non-idealities in the DAC and downstream analog circuitry.

The DAC may include N sub-DACs connected in parallel between an input demultiplexer and an output multiplexer, where N is an integer of one or more. The input demultiplexer to the DAC may be configured to sequentially supply symbols of the digital signal x[n] to the respective sub-DACs at a rate of Fs/N, and the output multiplexer of the DAC may be configured to combine outputs of the sub-DACs to obtain the analog signal having the effective sampling rate Fs.

The system may further include a multiplexer receiving phase correction and amplitude correction values addressed from the memory table, the multiplexer controlled by a modulus N counter to sequentially and repeatedly output the phase and amplitude correction values, allowing there to be a distinct correction table per sub-DAC. The system may still further include a selector receiving an output of the multiplexer and controlled according to the instantaneous frequency of the modulated phase signal $\varphi[n]$, and configured to apply the phase correction values to the second adder and the amplitude correction values to the multiplier. The system may store higher order derivatives of the phase and amplitude corrections and use interpolation of corrections to reduce the required table density.

The phase accumulator may be configured to output a frequency modulated phase signal, and the first adder may be configured to phase modulate the phase signal to obtain the modulated phase signal $\varphi[n]$. The multiplier may be further configured to amplitude modulate the periodic output signal y[n] to obtain the digital signal x[n].

The system may further include analog circuitry configured to transmit the analog signal to an analog output of the system. In this case, the phase correction values and the amplitude correction values may be further set to compensate for non-idealities in the analog circuitry.

According to another aspect of the inventive concepts, a digital signal generator is provided which is configured to generate a pre-distorted digital signal x[n] of a given sampling frequency Fs. The digital signal generator includes a phase accumulator and a first adder configured to output a modulated phase signal $\varphi[n]$, where $\varphi[n]$ denotes an instantaneous phase of each nth sample of the modulated phase signal $\varphi[n]$. The digital signal generator further includes a second adder configured to sum the modulated phase signal $\varphi[n]$ and a pre-distortion phase correction value to obtain a phase-corrected modulated phase signal $\varphi'[n]$. The digital signal generator still further includes a phase to amplitude converter configured to covert the phase-corrected modulated phase signal $\varphi'[n]$ to a periodic output signal y[n], and a multiplier configured to multiply the periodic output signal y[n] by a pre-distortion amplitude correction value to obtain the digital signal x[n]. The pre-distortion phase and amplitude correction values are frequency dependent, and the digital signal generator is configured to determine an instantaneous frequency of the modulated phase signal $\varphi[n]$ by computing a derivative of the modulated phase signal $\varphi[n]$, and to address a memory table correlating the determined instantaneous frequency with the pre-distortion phase and amplitude correction values.

According to still another aspect of the inventive concepts, a digital signal generator is provided that includes a numerically controlled oscillator (NCO) configured to generate a phase-modulated signal, and to convert the phase-modulated signal into a periodic output signal, and a pre-distortion module configured to adjust a phase of the phase-modulated signal prior to conversion to the periodic output signal, and to adjust an amplitude of the periodic output signal to obtain a pre-distorted digital output signal. The phase and amplitude adjustments are frequency dependent, and the pre-distortion module is configured to determine an instantaneous frequency of the NCO by computing a derivative of the phase-modulated signal, and to address a memory table correlating the determined instantaneous frequency with the phase and amplitude adjustments.

BRIEF DESCRIPTION OF DRAWINGS

The above and other aspects and features of the inventive concepts will become readily apparent from the detailed description that follows, with reference to the accompanying drawings, in which.

DETAILED DESCRIPTION

Figure 1:
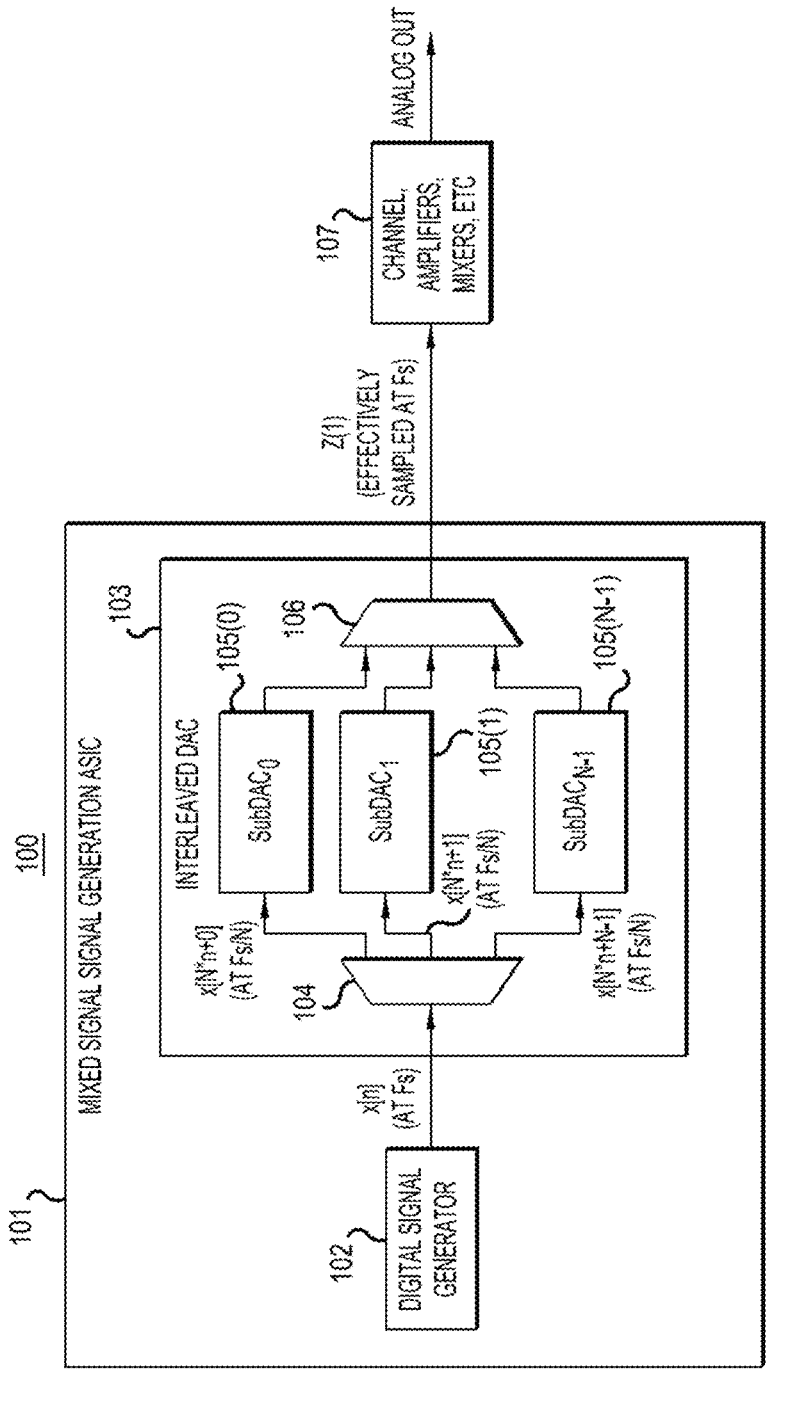
FIG. 1 is a block diagram of a signal generation system utilizing interleaved digital-to-analog converters (DACs) to which embodiments of the inventive concepts may be applied.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted to avoid obscuring the description of the example embodiments. Such methods and apparatuses are clearly within the scope of the present teachings. Further, throughout the drawings, like reference numbers refer to the same or similar elements.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices. Further, for example, when one element is described as being "connected to" another element, the one element may be directly connected to the other element, or indirectly connected to the other element in an operative manner. Separately, as is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, in the absence of an indication to the contrary, the units and/or modules being implemented by microprocessors or similar may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the example embodiments. Conversely, the blocks, units and/or modules of the example embodiments may be physically combined into more complex blocks, units and/or modules without departing from the scope of the example embodiments.

Embodiments of the inventive concepts relate to a system designed to address the challenges associated with non-idealities in digital-to-analog converters (DACs) and channel non-flatness in signal generation systems. The system includes a digital signal generator and a DAC. The digital signal generator is configured to generate a digital signal of a given sampling frequency. The DAC is configured to convert the digital signal to an analog signal having an effective sampling frequency.

The digital signal generator includes a phase accumulator, a first adder, a second adder, a phase to amplitude converter, and a multiplier. The phase accumulator outputs a phase signal to the first adder which modulates the phase signal to obtain a modulated phase signal, the instantaneous phase of which is denoted by each nth sample of the modulated phase signal. The adder sums the modulated phase signal and a phase correction value to obtain a phase-corrected modulated phase signal. The phase to amplitude converter converts the phase-corrected modulated phase signal to a periodic output signal. The multiplier amplitude modulates the periodic signal and multiplies the periodic output signal by an amplitude correction value to obtain the digital signal.

The system is configured to determine an instantaneous frequency of the modulated phase signal by computing a derivative of the modulated phase signal, and to address a memory table correlating the determined instantaneous frequency with the phase and amplitude correction values. The phase correction value and the amplitude correction value are set to compensate for non-idealities in the DAC and in the analog circuitry.

In some embodiments, the DAC comprises multiple sub-DACs connected in parallel between an input demultiplexer and an output multiplexer. The input demultiplexer sequentially supplies symbols of the digital signal to the respective sub-DACs at a rate of the sampling frequency divided by the number of sub-DACs. The output multiplexer combines outputs of the sub-DACs to obtain the analog signal having the effective sampling rate.

The system may further include a memory storing pairs of phase correction and amplitude correction values for the sub-DACs, respectively. In some cases, the system may also include a multiplexer and a selector for sequentially and repeatedly stepping through the corrections for each sub-DAC, outputting the pairs of phase and amplitude correction values.

The disclosed system provides an efficient way to correct for non-idealities in DACs and channel non-flatness in signal generation systems, particularly in the generation of continuous wave signals.

FIG. 1 is a block diagram of a signal generation system 100 utilizing interleaved digital-to-analog converters (DACs) to which embodiments of the inventive concepts may be applied.

In the example of FIG. 1, the system 100 includes a Mixed Signal Signal Generation (MSSG) ASIC 101 and analog circuitry 107. The MSSG ASIC 101 includes a digital signal generator 102 and an interleaved digital-to-analog converter (DAC) 103. The digital signal generator 102, which will be described in greater detail below, is configured to generate a digital signal x[n] of a given sampling frequency Fs. The DAC 103 is configured to convert the digital signal x[n] to an analog signal Z(t) having an effective sampling frequency Fs. This analog signal Z(t) is subsequently processed by the analog circuitry 107, which may include channels, amplifiers, mixers, and other components, ultimately producing the final analog output ("Analog out") of the system 100.

The interleaved DAC 103, the configuration of which is known in the art, includes an input demultiplexer (DEMUX) 104 that receives the digital signal x[n] from the digital signal generator 102. The DEMUX 104 is configured to distribute the digital signal x[n] to multiple sub-DACs, specifically sub-DAC$_0$ 105(0), sub-DAC$_1$ 105(1), and sub-DAC$_{(N-1)}$ 105(N−1). Each sub-DAC operates at a reduced sampling frequency of Fs/N, where N is the number of sub-DACs.

The outputs from these sub-DACs are then combined by another multiplexer (MUX) 106 to produce the analog signal Z(t) having the effective sampling rate Fs.

The inventive concepts, in the case of the example of FIG. 1, provide a relatively efficient technique to carry out digital pre-distortion on a class of signals to correct for channel/DAC non-flatness and DAC time interleave errors. Channel/DAC non-flatness (hereinafter referred to simply as channel non-flatness) can be caused by a number of factors, including the sin(f)/f response that most DACs have from their zero-order-hold type response, phase distortions resulting from a non-symmetric impulse response, and ripples in the frequency response due to reflections of high-speed interconnects. DAC time interleave errors can result from impulse response mismatches of the interleaved sub-DACs, and from non-idealities in the interleaving process which can lead to spurs in the output spectra, thus degrading spurious-free dynamic range (SFDR).

Figure 2:
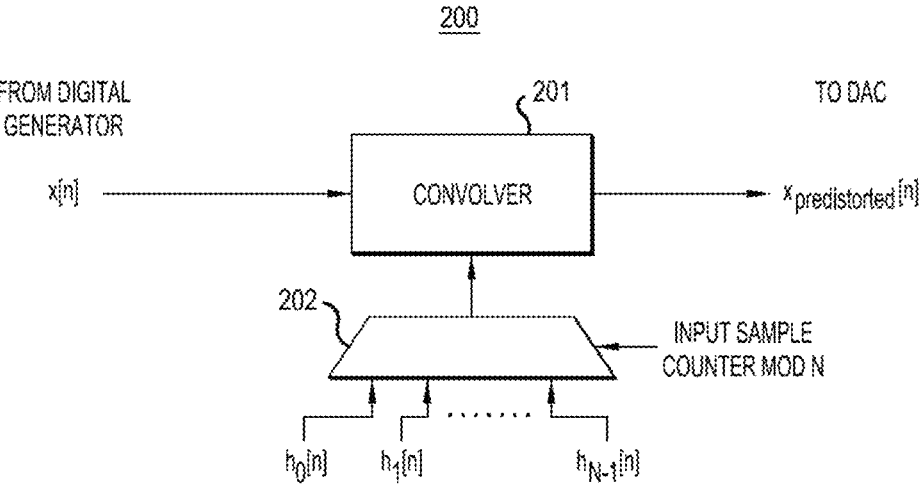
FIG. 2 is a block diagram illustrating a conventional Linear Periodic Time Varying Filter (LPTVF)

A typical way to solve these issues is by implementing a Linear Periodic Time Varying Filter (LPTVF) 200, an example of which is shown in the block diagram of FIG. 2.

Referring to FIG. 2, LPTVF 200 is well known in the art and includes a convolver 201 and counter modulus N switch 202. The convolver 201 receives the digital signal x[n] from a digital signal generator and outputs a pre-distorted signal x$_{predistorted}$[n] to an interleaved DAC. As shown, for an interleave-by-N system, N impulse responses h$_0$[n] through h$_{N-1}$[n] are provided. The convolver 201 utilizes a sequence of the impulse responses h$_0$[n], h$_1$[n] . . . h$_{N-1}$[n], each corresponding to different sub-DACs of the interleaved DAC system.

In some aspects, the counter modulus N switch 202 operates in a modulo-N fashion to select the appropriate impulse response for each sample.

This setup aims to mitigate issues such as channel non-flatness and time interleave errors by dynamically adjusting the digital signal before it undergoes digital-to-analog conversion. This dynamic adjustment is achieved by using a convolution operation at a potentially high sample rate. However, these filters can be computationally expensive in correcting for non-idealities in the analog domain.

The inventive concepts leverage the fact that many generator systems simply need to generate a (potentially narrowband modulated) continuous wave (CW) signal rather than a broadband signal. The CW signal may potentially be amplitude modulated, phase modulated, frequency modulated, or chirped. These signals may be generated via a numerically controlled oscillator (NCO), such as the NCO 300 illustrated by the block diagram of FIG. 3.

Figure 3:
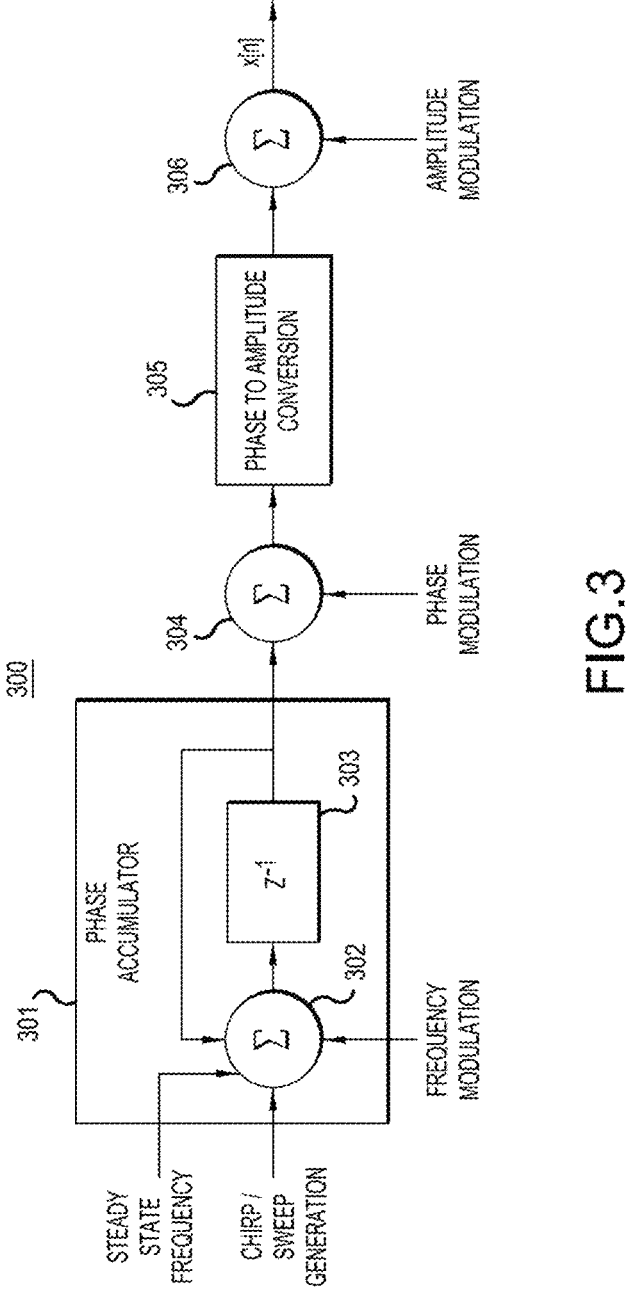
FIG. 3 is a block diagram of a narrowband modulated continuous wave (CW) signal generator to which embodiments of the inventive concepts may be applied.

Referring to FIG. 3, the NCO 300 is well known in the art and includes a phase accumulator 301 that receives inputs from both a steady-state frequency source and a chirp/sweep generation signal, as well as a frequency modulation signal. These inputs, together with a feedback signal, are combined using an adder 302 to perform frequency modulation. The output of the adder 302 is fed into a delay 303, the output of which constitutes the feedback signal. The delayed signal also constitutes an output of the phase accumulator 301.

The output of the phase accumulator is summed with a phase modulation signal using an adder 304 of the NCO 300. Following this, the phase-modulated signal undergoes phase to amplitude conversion (PAC) 305, transforming the phase information into amplitude information. Finally, the amplitude signal is multiplied using a multiplier 306 by an amplitude modulation signal to produce the output digital signal x[n].

The NCO 300 has a relatively narrowband output and also contains information of its instantaneous frequency as the derivative of the phase input to the PAC 305. The inventive concepts utilize these ideas to develop an improved circuit with corrections without needing to use a full convolver as in FIG. 2.

Figure 4:
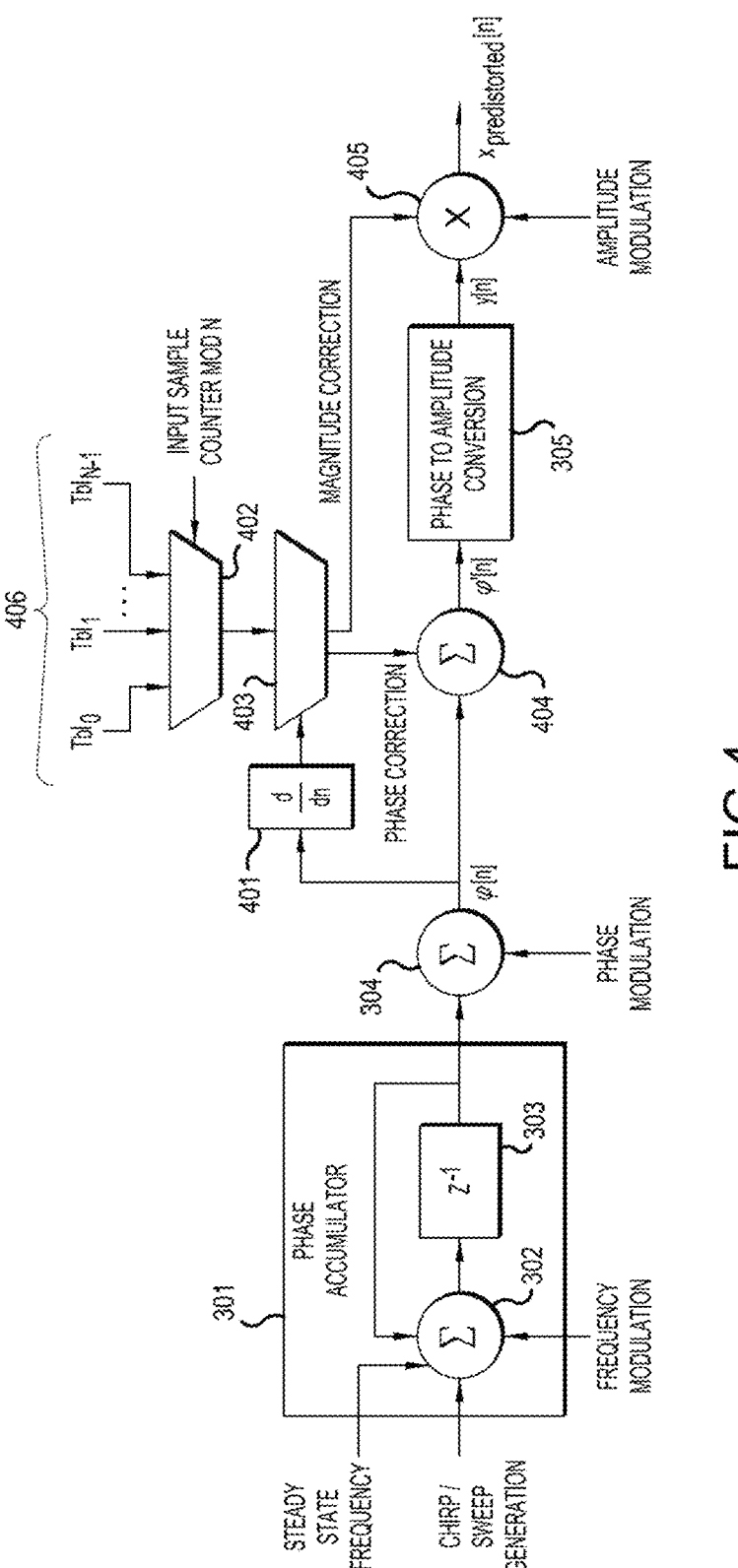
FIG. 4 is a block diagram of digital signal generator according to embodiments of the inventive concepts.

FIG. 4 is a block diagram of digital signal generator 400 according to embodiments of the inventive concepts. The digital signal generator 400 is configured to generate a pre-distorted digital signal x[n] of a given sampling frequency Fs.

Referring to FIG. 4, digital signal generator 400 of the illustrated example includes most of the same components of the NCO 300 described above in connection with FIG. 3. For example, as shown, the digital signal generator 400 includes a phase accumulator 301 and first adder 304 configured to output a modulated phase signal φ[n]. Here, the signal φ[n] denotes an instantaneous phase of each nth sample of the modulated phase signal φ[n].

Unlike the NCO 300 of FIG. 3, however, the digital signal generator 400 includes a second adder 404 configured to sum the modulated phase signal φ[n] and a pre-distortion phase correction value to obtain a phase-corrected (or phase-distorted) modulated phase signal φ'[n].

Still referring to FIG. 4, the phase-corrected modulated phase signal φ'[n] is applied a phase to amplitude converter (PAC) 304. The PAC 304 is configured to covert the phase-corrected modulated phase signal φ'[n] to a periodic output signal y[n].

Like the multiplier 306 of the NCO 300 of FIG. 3, a multiplier 405 of the signal generator 400 is configured to amplitude modulate the periodic output signal y[n]. In addition, however, the multiplier 405 is further configured to multiply the periodic output signal y[n] by a pre-distortion amplitude correction value to obtain the pre-distorted digital signal x[n]

The pre-distortion phase and amplitude correction values discussed above are frequency dependent. The signal generator 400 is configured to determine an instantaneous frequency of the modulated phase signal φ[n] by computing a derivative (at 401 of FIG. 4) of the modulated phase signal φ[n], and to address a memory table (generally represented at 406 of FIG. 4) correlating the determined instantaneous frequency with the pre-distortion phase and amplitude correction values.

In the example of FIG. 4, the signal generator 400 includes a multiplexer 402 receiving phase correction and amplitude correction values addressed from the memory table. The multiplexer 402 controlled by a modulus N counter to sequentially and repeatedly output the proper phase and amplitude correction values for a given sub-DAC. Also in the example of FIG. 4, the signal generator 400 further includes a selector 403 that receives an output of the multiplexer 402 and is controlled according to the instantaneous frequency of the modulated phase signal. The selector 403 is configured to apply the phase correction values to the second adder 404 and the amplitude correction values to the multiplier 405.

It is noted that in some designs the memories that feed the multiplexer 402 in FIG. 4 may simply coexist, since a given index of a sample will always be applied to the same design. For example, in the case where there are 2 sub-DACs and a multiple of 2 samples are being process every clock cycle, the even samples will always reference memory 0 and the odd samples will always reference memory 1. In that case, there is not a need to hardware mux between the two memories.

In the example of FIG. 4, the derivative of the output of the phase modulation summing node is used to determine the instantaneous frequency of the signal. This allows the instantaneous frequency to be multiplexed from a programmable lookup table containing the appropriate magnitude and phase corrections, which are summed and multiplied as described above. If time varying corrections are required, then the table used can be multiplexed in on each input sample via MUX 402.

The embodiment essentially provides the sample performance as an LPTV, but only requires a derivative computation (which can be implemented as a simple first difference or central difference), some multiplexers, a summer, and a multiplier per output sample—rather than a full multiply accumulate per output sample.

In an actual implementation, the designer may choose to tradeoff table size for resolution of corrections. Implementors may store higher order derivatives of the magnitude and phase corrections and then use the MSBs of the instantaneous frequency to look into the table and the LSBs of the instantaneous frequency to interpolate with the derivatives between table values. Other variations will become apparent to those skilled in the art.

Since the computation to determine the instantaneous frequency is done after the chirp/sweep generator, PM modulation, and FM modulation, the correction will properly handle these modulations precisely. However, the correction is computed before the AM modulation is applied, which means that if the channel or subDAC mismatch is large between the carrier and the ends of sidebands, then there will be imperfect correction and residual frequency response distortion or spurs.

Thus FIG. 4 implements similar functionality to the cascade of the system in FIG. 3 into the system in FIG. 2, but utilizes much less power and area. The main limitation is that the configuration of FIG. 4 has a loss of generality and may only correct narrowband modulated CW-type signals or similar, rather than arbitrary signals.

Figure 5:
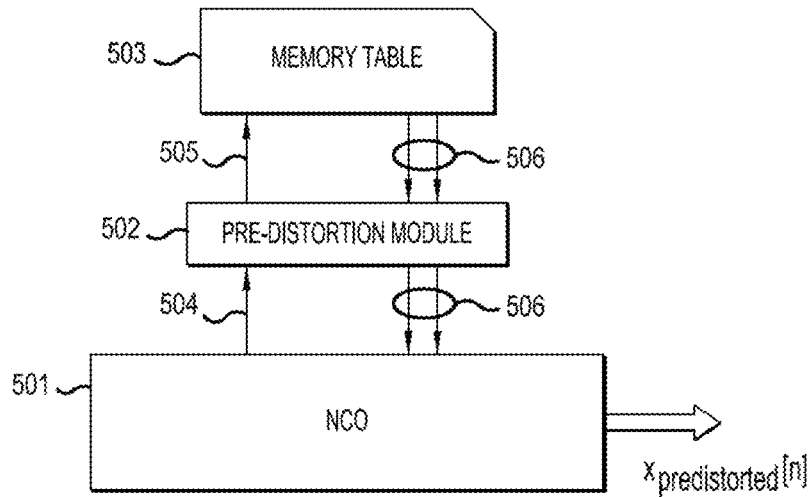
FIG. 5 is a block diagram of digital signal generator according to embodiments of the inventive concepts.

FIG. 5 is a block diagram of a signal generator 500 according to embodiments of the inventive concepts.

Referring to FIG. 5, the digital signal generator 500 includes a numerically controlled oscillator (NCO) configured to generate a phase-modulated signal in a manner as described above, for example. The NCO 501 is further configured to convert the phase-modulated signal to periodic output signal in a manner as described above, for example.

The digital signal generator further includes a pre-distortion module 502 configured to adjust a phase of the phase-modulated signal prior to conversion to the periodic output signal, and to adjust an amplitude of the periodic output signal to obtain a pre-distorted digital output signal $X_{predistorted}[n]$.

The phase and amplitude adjustments are frequency dependent. Still referring to FIG. 5, the pre-distortion module 502 is configured to determine an instantaneous frequency of the NCO 501 by computing a derivative of the phase-modulated signal 504, and to address a memory table 503 correlating the determined instantaneous frequency 505 with the phase and amplitude adjustments 506. The phase and amplitude adjustments 506 are read from the memory table and applied to the NCO 501 by the pre-distortion module 502.

The NCO 501 and/or pre-distortion module 502 may be configured in the same manner as illustrated in FIG. 4 as described above. However, the inventive concepts are not limited to the specific example of FIG. 4.

Further, in the examples above, the output of the signal generator is applied to the input of an interleaved DAC. However, even in systems with non-interleaved DACs, there may still be a need to correct for channel non-flatness due to, for example, non-idealities in the downstream analog circuitry. As such, the signal generator embodiments of the inventive concepts is not limited by the type of DAC to which it may be applied. In case of a non-interleaved DAC, the multiplexer 402 of FIG. 4 is not needed since essentially a simple linear time invariant convolution (LTI) is being performed rather than an LPTV.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. While representative embodiments are disclosed herein, one of ordinary skill in the art will appreciate that many variations that are in accordance with the present teachings are possible and remain within the scope of the appended claim set. The invention therefore is not to be restricted except within the scope of the appended claims.

What is claimed is:

1. A system comprising:

a digital signal generator configured to generate a digital signal x[n] of a given sampling frequency Fs; and a digital-to-analog converter (DAC) configured to convert the digital signal x[n] to an analog signal having an effective sampling frequency Fs;

wherein the digital signal generator comprises:

a phase accumulator and first adder configured to output a modulated phase signal φ[n], where φ[n] denotes an instantaneous phase of each nth sample of the modulated phase signal φ[n];

a second adder configured to sum the modulated phase signal φ[n] and a phase correction value to obtain a phase-corrected modulated phase signal φ'[n];

a phase to amplitude converter configured to covert the phase-corrected modulated phase signal φ'[n] to a periodic output signal y[n];

a multiplier configured to multiply the periodic output signal y[n] by an amplitude correction value to obtain the digital signal x[n];

wherein the phase and amplitude correction values are frequency dependent, and wherein the system is configured to determine an instantaneous frequency of the modulated phase signal φ[n] by computing a derivative of the modulated phase signal φ[n], and to address a memory table correlating the determined instantaneous frequency with the phase and amplitude correction values, and where the phase correction value and the amplitude correction value are set to compensate for non-idealities in the DAC.

2. The system of claim 1, wherein the digital signal x[n] is a continuous wave (CW) signal.

3. The system of claim 2, wherein the CW signal is a narrowband modulated CW signal.

4. The system of claim 1, wherein the DAC comprises N sub-DACs connected in parallel between an input multiplexer and an output multiplexer, where N is an integer of two or more, wherein the input demultiplexer is configured to sequentially supply symbols of the digital signal x[n] to the respective sub-DACs at a rate of Fs/N; and wherein the output multiplexer is configured to combine outputs of the sub-DACs to obtain the analog signal having the effective sampling rate Fs.

5. The system of claim 1, further comprising:

a multiplexer receiving phase correction and amplitude correction values addressed from the memory table, the multiplexer controlled by a modulus N counter to sequentially and repeatedly output the phase and amplitude correction values for the correct sub-DAC;

a selector receiving an output of the multiplexer and controlled according to the instantaneous frequency of the modulated phase signal y[n], and configured to apply the phase correction values to the second adder and the amplitude correction values to the multiplier.

6. The system of claim 1, wherein the phase accumulator is configured to output a frequency modulated phase signal, and the first adder is configured to phase modulate the phase signal to obtain the modulated phase signal y[n].

7. The system of claim 6, wherein the multiplier is further configured to amplitude modulate the periodic output signal y[n] to obtain the digital signal x[n].

8. The system of claim 1, further comprising analog circuitry configured to transmit the analog signal to an analog output of the system, wherein the phase correction value and the amplitude correction value are further set to compensate for non-idealities in the analog circuitry.

9. A digital signal generator configured to generate a pre-distorted digital signal x[n] of a given sampling frequency Fs, comprising:

a phase accumulator and first adder configured to output a modulated phase signal φ[n], where φ[n] denotes an instantaneous phase of each nth sample of the modulated phase signal φ[n];

a second adder configured to sum the modulated phase signal φ[n] and a pre-distortion phase correction value to obtain a phase-corrected modulated phase signal φ'[n];

a phase to amplitude converter configured to covert the phase-corrected modulated phase signal φ'[n] to a periodic output signal y[n];

a multiplier configured to multiply the periodic output signal y [n] by a pre-distortion amplitude correction value to obtain the digital signal x[n], wherein the pre-distortion phase and amplitude correction values are frequency dependent, and wherein the digital signal generator is configured to determine an instantaneous frequency of the modulated phase signal φ[n] by computing a derivative of the modulated phase signal φ[n], and to address a memory table correlating the determined instantaneous frequency with the pre-distortion phase and amplitude correction values.

10. The digital signal generator of claim 9, wherein the digital signal x[n] is a continuous wave (CW) signal.

11. The digital signal generator of claim 10, wherein the CW signal is a narrowband modulated CW signal.

12. The digital signal generator of claim 9, further comprising:

a multiplexer receiving phase correction and amplitude correction values addressed from the memory table, the multiplexer controlled by a modulus N counter to sequentially and repeatedly output the phase and amplitude correction values;

a selector receiving an output of the multiplexer and controlled according to the instantaneous frequency of the modulated phase signal φ[n], and configured to apply the phase correction values to the adder and the amplitude correction values to the multiplier.

13. The digital signal generator of claim 9, wherein the phase accumulator is configured to output a frequency modulated phase signal, and the first adder is configured to phase modulate the phase signal to obtain the modulated phase signal φ[n].

14. The digital signal generator of claim 13, wherein the multiplier is further configured to amplitude modulate the periodic output signal y[n] to obtain the digital signal x[n].

15. A digital signal generator, comprising a numerically controlled oscillator (NCO) configured to generate a phase-modulated signal, and to convert the phase-modulated signal to periodic output signal; and a pre-distortion module configured to adjust a phase of the phase-modulated signal prior to conversion to the periodic output signal, and to adjust an amplitude of the periodic output signal to obtain a pre-distorted digital output signal, wherein the phase and amplitude adjustments are frequency dependent, and wherein the pre-distortion module is configured to determine an instantaneous frequency of the NCO by computing a derivative of the phase-modulated signal, and to address a memory table correlating the determined instantaneous frequency with the phase and amplitude adjustments.

16. The digital signal generator of claim 15, wherein the pre-distorted digital output signal is a continuous wave (CW) signal.

17. The digital signal generator of claim 16, wherein the CW signal is a narrowband modulated CW signal.

* * * * *